US010734372B2

United States Patent
Anderson et al.

(10) Patent No.: US 10,734,372 B2
(45) Date of Patent: Aug. 4, 2020

(54) VERTICAL TRANSPORT STATIC RANDOM-ACCESS MEMORY CELLS WITH TRANSISTORS OF ACTIVE REGIONS ARRANGED IN LINEAR ROWS

(71) Applicant: International Business Machines Corporation, Armonk, NY (US)

(72) Inventors: Brent A. Anderson, Jericho, VT (US); Stuart A. Sieg, Albany, NY (US); Junli Wang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 15/923,683

(22) Filed: Mar. 16, 2018

(65) Prior Publication Data

US 2019/0287957 A1    Sep. 19, 2019

(51) Int. Cl.
*H01L 27/02*    (2006.01)
*H01L 27/11*    (2006.01)
(Continued)

(52) U.S. Cl.
CPC .......... *H01L 27/0207* (2013.01); *G11C 11/41* (2013.01); *G11C 11/412* (2013.01); *H01L 21/02603* (2013.01); *H01L 21/823807* (2013.01); *H01L 21/823828* (2013.01); *H01L 21/823885* (2013.01); *H01L 27/092* (2013.01); *H01L 27/11* (2013.01); *H01L 27/1104* (2013.01); *H01L 27/1108* (2013.01); *H01L 29/0676* (2013.01); *H01L 29/42392* (2013.01);

*H01L 29/78642* (2013.01); *H01L 29/78696* (2013.01); *H01L 2924/1437* (2013.01)

(58) Field of Classification Search
CPC .. H01L 27/11; H01L 27/1104; H01L 27/1108; H01L 2924/1437; H01L 27/0207; G11C 11/412

See application file for complete search history.

(56) References Cited

U.S. PATENT DOCUMENTS 7,138,685 B2    11/2006    Hsu et al.
9,362,292 B1    6/2016    Liaw
(Continued)

OTHER PUBLICATIONS

Huynh-Bao et al., "A Comprehensive Benchmark and Optimization of 5-nm Lateral and Vertical GAA 6T-SRAMs," IEEE Transaction on Electron Devices, Feb. 2016, pp. 643-651, vol. 63, No. 2.

*Primary Examiner* — Jose R Diaz
(74) *Attorney, Agent, or Firm* — Vazken Alexanian; Ryan, Mason & Lewis, LLP (57) ABSTRACT

A semiconductor structure includes a vertical transport static random-access memory (SRAM) cell having a first active region and a second active region. The first active region and the second active region are linearly arranged in first and second rows, respectively. The first row of the first active region includes a first pull-up transistor, a first pull-down transistor and a first pass gate transistor, and the second row of the second active region includes a second pull-up transistor, a second pull-down transistor and a second pass gate transistor. A first gate region of the first active region extends orthogonal from the first row to the second active region, and a second gate region of the second active region extends orthogonal from the second row to the first active region.

20 Claims, 6 Drawing Sheets

(51) Int. Cl.
*H01L 27/092* (2006.01)
*H01L 29/06* (2006.01)
*H01L 29/423* (2006.01)
*H01L 21/8238* (2006.01)
*H01L 29/786* (2006.01)
*H01L 21/02* (2006.01)
*G11C 11/41* (2006.01)
*G11C 11/412* (2006.01)

(56) References Cited

U.S. PATENT DOCUMENTS

| | | |
|---|---|---|
| 9,620,509 B1 | 4/2017 | Pao et al. |
| 9,680,473 B1 | 6/2017 | Anderson et al. |
| 9,711,511 B1 | 7/2017 | Lim et al. |
| 9,761,712 B1 | 9/2017 | Anderson et al. |
| 9,825,032 B1 | 11/2017 | Bentley et al. |
| 10,109,637 B1 * | 10/2018 | Zang .................. H01L 27/1104 |
| 2017/0148799 A1 | 5/2017 | Basker et al. |

* cited by examiner

VERTICAL TRANSPORT STATIC RANDOM-ACCESS MEMORY CELLS WITH TRANSISTORS OF ACTIVE REGIONS ARRANGED IN LINEAR ROWS

BACKGROUND

The present application relates to semiconductors, and more specifically, to techniques for forming semiconductor structures. Static random-access memory (SRAM) is a type of memory device that offers high speed, low power consumption and simple operation. Unlike dynamic random-access memory (DRAM), SRAM does not need to regularly refresh stored data and has a straightforward design.

SUMMARY

Embodiments of the invention provide techniques for forming vertical transport static random-access memory (SRAM) cells with improved layouts comprising pull-up, pull-down and pass gate transistors sharing common active regions formed linearly in two rows.

In one embodiment, a semiconductor structure comprises a vertical transport SRAM cell comprising a first active region and a second active region. The first active region and the second active region are linearly arranged in first and second rows, respectively. The first row of the first active region comprises a first pull-up transistor, a first pull-down transistor and a first pass gate transistor, and the second row of the second active region comprises a second pull-up transistor, a second pull-down transistor and a second pass gate transistor. A first gate region of the first active region extends orthogonal from the first row to the second active region, and a second gate region of the second active region extends orthogonal from the second row to the first active region.

In another embodiment, an integrated circuit comprises a vertical transport SRAM device comprising one or more SRAM cells. A given one of the SRAM cells comprises a first active region and a second active region. The first active region and the second active region are linearly arranged in first and second rows, respectively. The first row of the first active region comprises a first pull-up transistor, a first pull-down transistor and a first pass gate transistor. The second row of the second active region comprises a second pull-up transistor, a second pull-down transistor and a second pass gate transistor. A first gate region of the first active region extends orthogonal from the first row to the second active region, and a second gate region of the second active region extends orthogonal from the second row to the first active region.

In another embodiment, a method of forming a semiconductor structure comprises forming a first active region comprising a first pull-up transistor, a first pull-down transistor and a first pass-gate transistor arranged linearly in a first row, forming a second active region comprising a second pull-up transistor, a second pull-down transistor and a second pass-gate transistor arranged linearly in a second row, forming a first gate region for the first active region that extends orthogonal from the first row to the second active region, and forming a second gate region for the second active region that extends orthogonal from the second row to the first active region. The first active region and the second active region provide a vertical transport SRAM cell.

DETAILED DESCRIPTION

Illustrative embodiments of the invention may be described herein in the context of illustrative methods for forming vertical transport static random-access memory with improved layout, along with illustrative apparatus, systems and devices having self-aligned contacts formed using such methods. However, it is to be understood that embodiments of the invention are not limited to the illustrative methods, apparatus, systems and devices but instead are more broadly applicable to other suitable methods, apparatus, systems and devices.

Static random-access memory (SRAM), as described above, is a type of semiconductor memory device that may be used for various applications. SRAM cells may be formed using varying numbers of transistors. The six transistor (6T) SRAM cell is widely used as a primary memory in microprocessor circuits. Continued efforts are being made to design integrated circuit chips having the greatest possible number of individual 6T SRAM cells, in order to provide the integrated circuit chip with as much memory as possible within the available area thereon. To achieve this goal, integrated circuit designers have been developing layouts for the transistors making up the SRAM cells to reduce the area required for each.

SRAM cell size scaling is a complex and challenging problem, due at least in part to layout issues with complex active region (RX) shapes and cut masks that are used to form SRAM cells. Embodiments provide improved layouts for SRAM cells, reducing RX pattern complexity while also reducing feature size and spacing resulting in improved manufacturability and reduced cell size. Some embodiments advantageously provide for efficient gate-to-adjacent cell strapping as will be described in further detail below.

Figure 1:
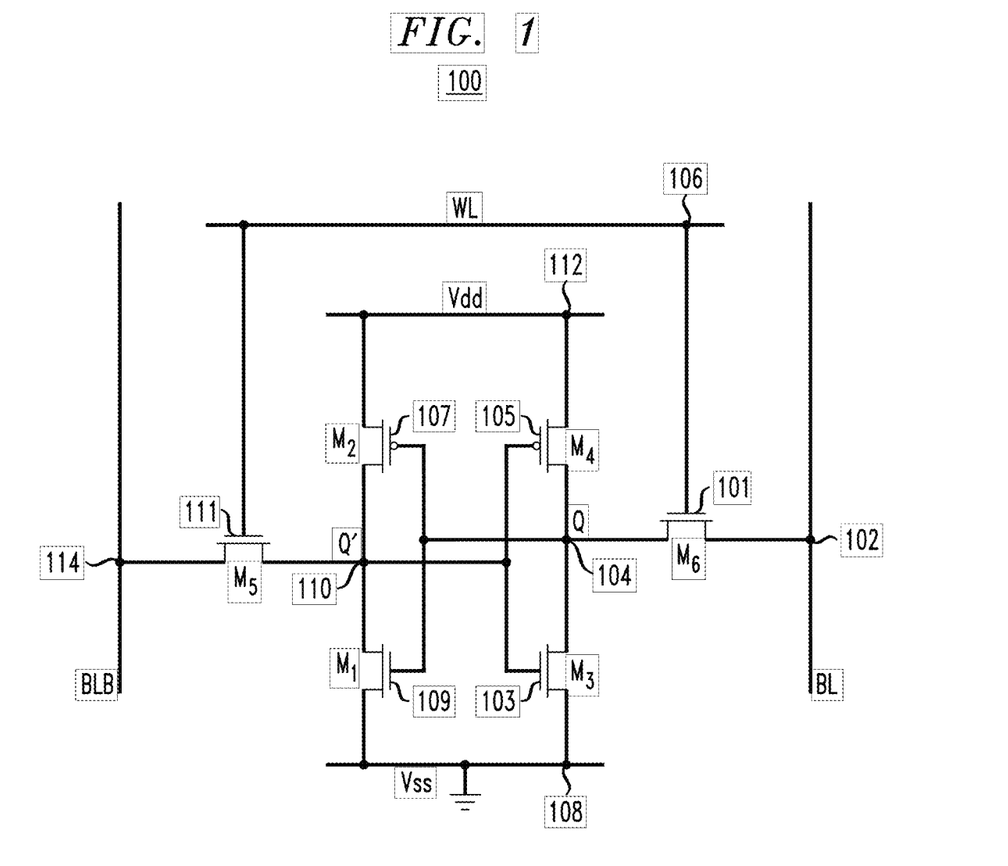
FIG. 1 depicts a circuit diagram of a static random access memory, according to an embodiment of the present invention.

FIG. 1 shows a circuit diagram 100 of a SRAM, specifically a 6T SRAM cell. The 6T SRAM cell includes a first NFET device ($M_6$) 101 connected to a first bit line node (BL) 102, a first output node (Q) 104, and a word line node (WL) 106. A second NFET device ($M_3$) 103 is connected to the Q node 104, a ground node (Vss) 108, and a second output node (Q') 110. A first PFET device ($M_4$) 105 is connected to the Q node 104, the Q' node 110, and a voltage source node (Vdd) 112. A second PFET device ($M_2$) 107 is connected to the Vdd node 112, the Q node 104, and the Q' node 110. A third NFET device ($M_1$) 109 is connected to the Vss node 108, the Q node 104, and the Q' node 110. A fourth NFET device ($M_5$) 111 is connected to a second bit line node (BLB) 114, the WL node 106, and the Q' node 110. The first and fourth NFET devices ($M_6$ and $M_5$, respectively) are the pass-gate (PG) transistors of the 6T SRAM cell. The second and third NFET devices ($M_3$ and $M_1$, respectively) are the pull-down (PD) transistors of the 6T SRAM cell, and the first and second PFET devices ($M_4$ and $M_2$, respectively) are the pull-up (PU) transistors of the 6T SRAM cell.

A bit is stored in the 6T SRAM cell of FIG. 1 on the load or PU transistors ($M_4$ and $M_2$) and the driver or PD transistors ($M_3$ and $M_1$), which form a flip-flop circuit containing a balanced pair of cross-coupled inverters. The 6T SRAM cell of FIG. 1 has two stable states which are used to denote bit values of 0 and 1. The access or PG transistors ($M_6$ and $M_5$) serve to control access to the storage cell during read and write operations. More particularly, the PG transistors connect the complementary outputs of the cross coupled inverter to the complementary pair of bit lines BL and BLB. The word line WL connected to the gates of the PG transistors selects connecting the cell to the bit lines BL and BLB.

Figure 2:
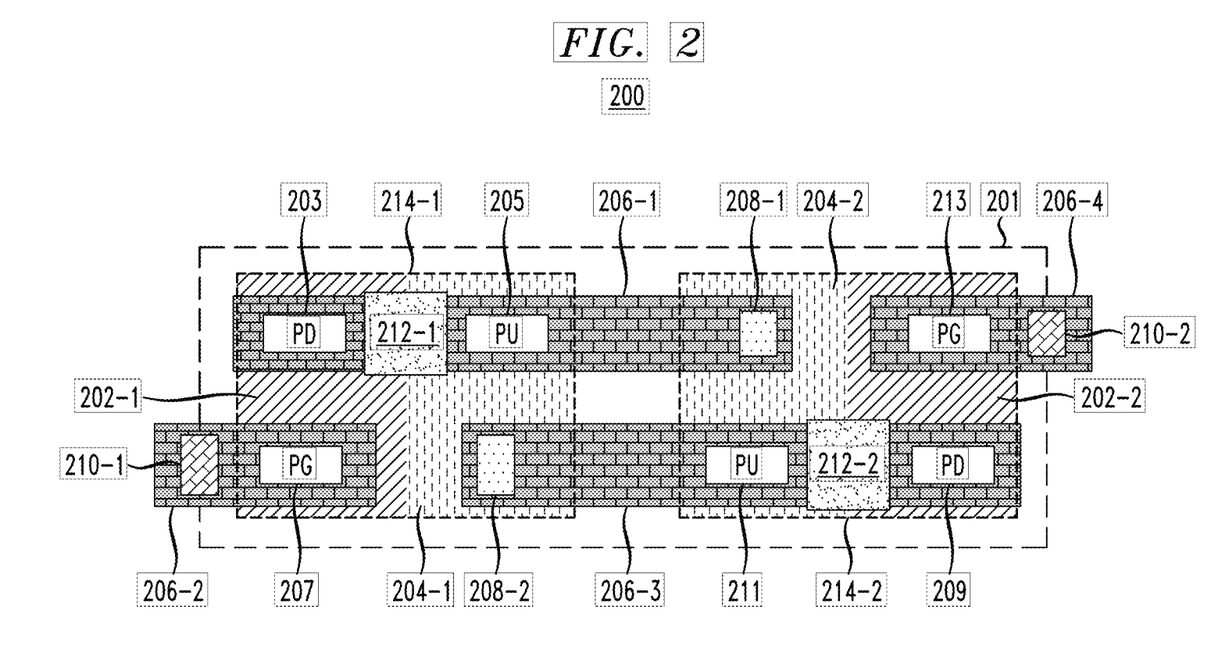
FIG. 2 is a plan view of a layout of a memory cell, according to an embodiment of the present invention.

FIG. 2 shows a plan view 200 of a layout of a 6T SRAM cell 201, including PD transistors 203 and 209, PU transistors 205 and 211, and PG transistors 207 and 213. The transistors 203, 205, 207, 209, 211 and 213 may be nanowire or nanosheet based vertical transistors, such as gate all-around (GAA) nanowire or nanosheet transistors.

The dashed outline of cell 201 indicates the boundary area of the cell 201. The PD transistor 203, PU transistor 205 and PG transistor 207 share an active region 214-1 (e.g., these transistors share a common bottom source/drain region). The active region 214-1 includes an n-type region 202-1 and a p-type region 204-1. The n-type region 202-1 and p-type region 204-1 are electrically connected by either a metal silicide or a contact (not shown in FIG. 2). Gate region 206-1 is shared between the PD transistor 203 and PU transistor 205. Another gate region 206-2 is formed for the PG transistor 207. As shown in FIG. 2, the gate region 206-1 extends so as to form a gate strap 208-1 to active region 214-2. A contact 210-1 to the gate region 206-2 for PG transistor 207 is shown as illustrated. This contact 210-1 may be a shared contact with an adjacent memory cell not shown in FIG. 2. Patterning masks 212-1 and 212-2 are shown as illustrated, and keep the gates of the PD transistor 203 and PU transistor 205 connected.

The active region 214-2 includes PD transistor 209, PU transistor 211 and PG transistor 213. The active region 214-2, similar to active region 214-1, includes an n-type region 202-2 and a p-type region 204-2. Gate region 206-3 is shared between the PD transistor 209 and the PU transistor 211. Another gate region 206-4 is formed for the PG transistor 213. As shown in FIG. 2, the gate region 206-3 extends so as to form a gate strap 208-2 to active region 214-1. A contact 210-2 to the gate region 206-4 for PG transistor 213 is shown as illustrated. This contact 210-2, similar to the contact 210-1, may be a shared contact with an adjacent memory cell not shown in FIG. 2.

The gate straps 208-1 and 208-2 (collectively, gate straps 208) provide connections from a gate region to an adjacent bottom source/drain region. For example, the gate straps 208 provide connections of the gate to the n and p regions of active regions 214-1 and 214-2 (collectively, active regions 214).

In the FIG. 2 layout of the memory cell 201, the gate straps 208 are formed parallel to the gate regions 206-1 and 206-3. In some embodiments, gate straps are formed perpendicular to gate regions so as to provide an improved SRAM cell layout. Improved SRAM cell layouts described herein reduce the active region pattern complexity, while also reducing feature size and spacing resulting in improved manufacturability and reduced cell size. Efficient gate to adjacent cell strapping is provided in such improved SRAM cell layouts.

Figure 3:
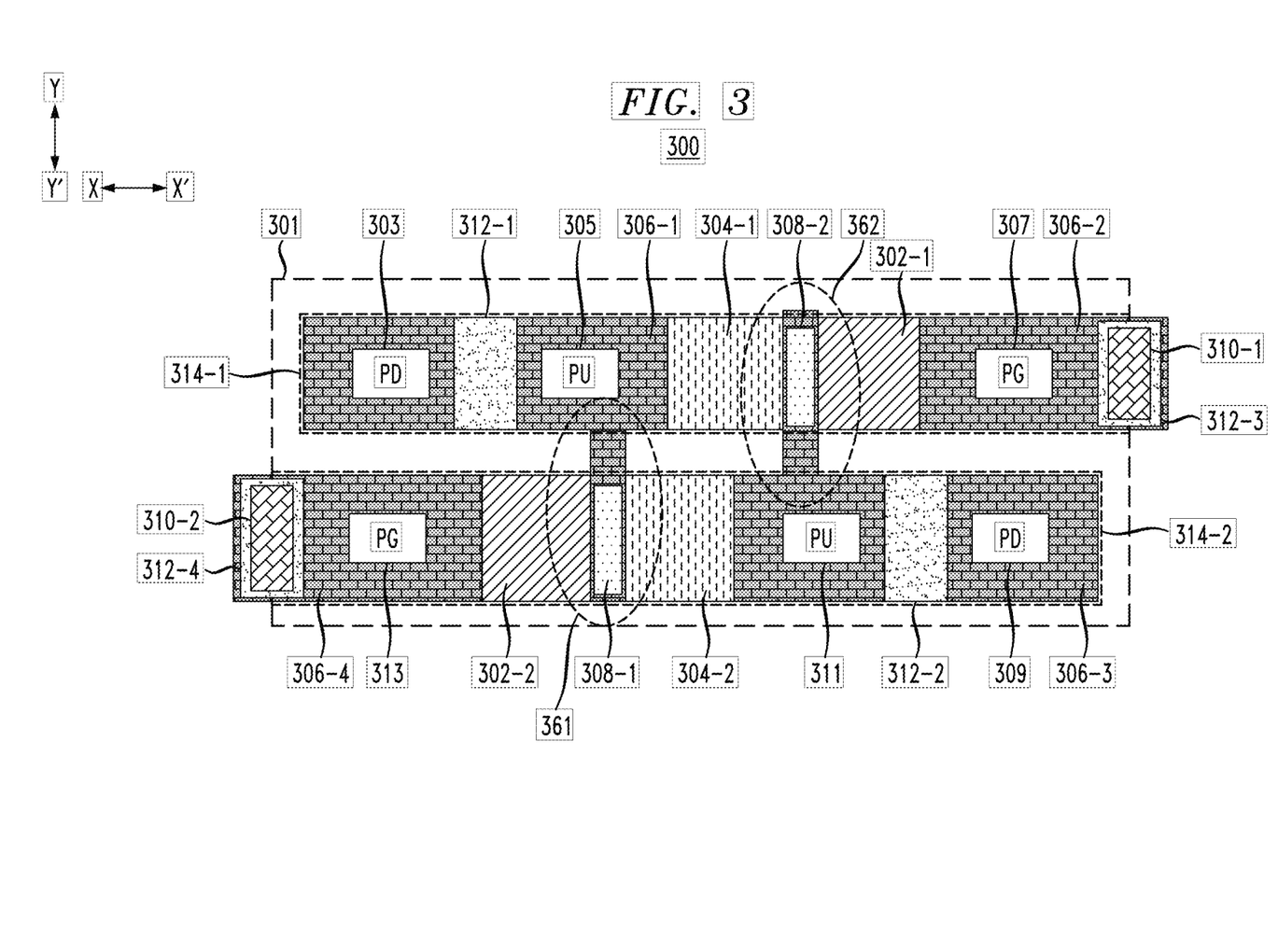
FIG. 3 is a plan view of an improved layout of a memory cell, according to an embodiment of the present invention.

FIG. 3 shows a plan view 300 of an improved layout of an SRAM cell 301, including PD transistors 303 and 309, PU transistors 305 and 311, and PG transistors 307 and 313. The transistors 303, 305, 307, 309, 311 and 313 may be nanowire or nanosheet based vertical transistors, such as gate all-around (GAA) nanowire or nanosheet transistors.

The transistors 303, 305, 307, 309, 311 and 313 may be formed of silicon (Si), germanium (Ge), silicon germanium (SiGe), silicon carbide (SiC), or other group III-V materials. The transistors 303, 305, 307, 309, 311 and 313 may have dimensions in the X-X' direction ranging from 4 nanometers (nm) to 15 nm, and in the Y-Y' direction ranging from 4 nm to 40 nm. In a Z-Z' direction into or through the page, the gate length of the transistors 303, 305, 307, 309, 311 and 313 may range from 10 nm to 30 nm.

The dashed outline of cell 301 indicates the boundary area of the cell 301. The PD transistor 303, PU transistor 305 and PG transistor 307 share an active region 314-1 (e.g., these transistors share a common bottom source/drain region). The active region 314-1 includes an n-type region 302-1 and a p-type region 304-1.

Gate region 306-1 is shared between the PD transistor 303 and PU transistor 305. Gate region 306-2 is formed for the PG transistor 307. As shown in FIG. 3, the gate region 306-1 extends so as to form a gate strap 308-1 to active region 314-2. The gate region 306-1 extends perpendicular to active region 314-1 forming gate region 361 highlighted in FIG. 3.

Contact 310-1 to the gate region 306-2 for PG transistor 307 is shown as illustrated. This contact 310-1 may be a shared contact with an adjacent memory cell not shown in FIG. 3. Various patterning masks 312-1 and 312-3 are shown as illustrated.

The active region 314-2 includes PD transistor 309, PU transistor 311 and PG transistor 313. The active region 314-2, similar to active region 314-1, includes an n-type region 302-2 and a p-type region 304-2.

Gate region 306-3 is shared between the PD transistor 309 and the PU transistor 311. Gate region 306-4 is formed for the PG transistor 313. As shown in FIG. 3, the gate region 306-3 extends so as to form a gate strap 308-2 to active region 314-1. The gate region 306-3 extends perpendicular to active region 314-2 forming gate region 362 highlighted in FIG. 3.

Contact 310-2 to the gate region 306-4 for PG transistor 313 is shown as illustrated. This contact 310-2 may be a shared contact with an adjacent memory cell not shown in FIG. 3. Various patterning masks 312-2 and 312-4 are shown as illustrated.

Figure 4:
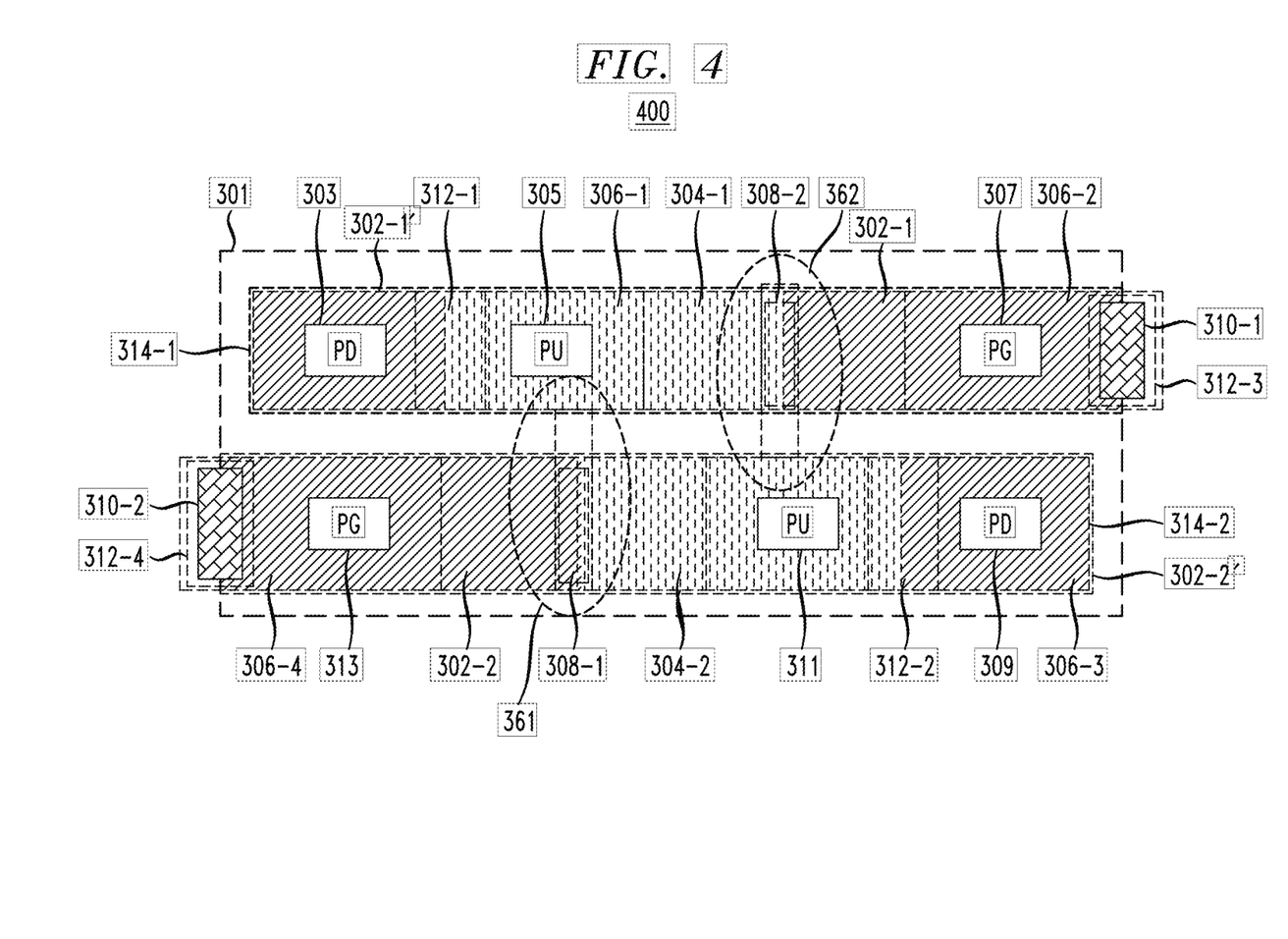
FIG. 4 is a plan view of the improved layout of the FIG. 3 memory cell highlighting formation and boundaries between n and p type regions, according to an embodiment of the present invention.

In the FIG. 3 plan layout, the n and p type regions of active regions 314-1 and 314-2 further extend below the gate regions 306-1, 306-2, 306-3 and 306-4 (collectively, gate regions 306), gate straps 308-1 and 308-2 (collectively, gate straps 308) and mask regions 312-1, 312-2, 312-3 and 312-4 (collectively, mask regions 312) as will now be described with respect to FIG. 4. FIG. 4 shows a plan layout view 400 where the gate regions 306, gate straps 308 and mask regions 312 of FIG. 3 are shown only in dashed outline to highlight where the n and p type regions are formed.

The n-type region 302-1, as illustrated in FIG. 4, extends below the gate region 306-2 to the right edge of the active region 314-1 (e.g., towards contact 310-1). An additional n-type region, labeled 302-1', is also formed below the gate region 306-1 extending from the left edge of the active region 314-1 (e.g., the edge opposite contact 310-1) towards a middle of the mask region 312-1 adjacent the left edge of the p-type region 304-1. The right edge of the p-type region 304-1 is adjacent the left edge of the n-type region 302-1 where they meet in the middle below gate strap 308-2.

In a similar manner, the n-type region 302-2 extends below the gate region 306-4 to the left edge of the active region 314-2 (e.g., towards contact 310-2). An additional n-type region, labeled 302-2', is also formed below the gate region 306-3 extending from the right edge of the active region 314-2 (e.g., the edge opposite contact 310-2) towards a middle of the mask region 312-2 adjacent the right edge of the p-type region 304-2. The left edge of the p-type region 304-2 is adjacent the right edge of the n-type region 302-2 where they meet in the middle below gate strap 308-1.

The gate straps 308 provide connections between the bottom/source drain regions of the different active regions. For example, the gate strap 308-1 provides a connection between the n-type region 302-1 of active region 314-1 and the n-type region 302-2 and p-type region 304-2 of active region 314-2. Similarly, the gate strap 308-2 provides a connection between the p-type region 304-2 of active region 314-2 and the n-type region 302-1 and p-type region 304-1 of active region 314-1.

Figure 5:
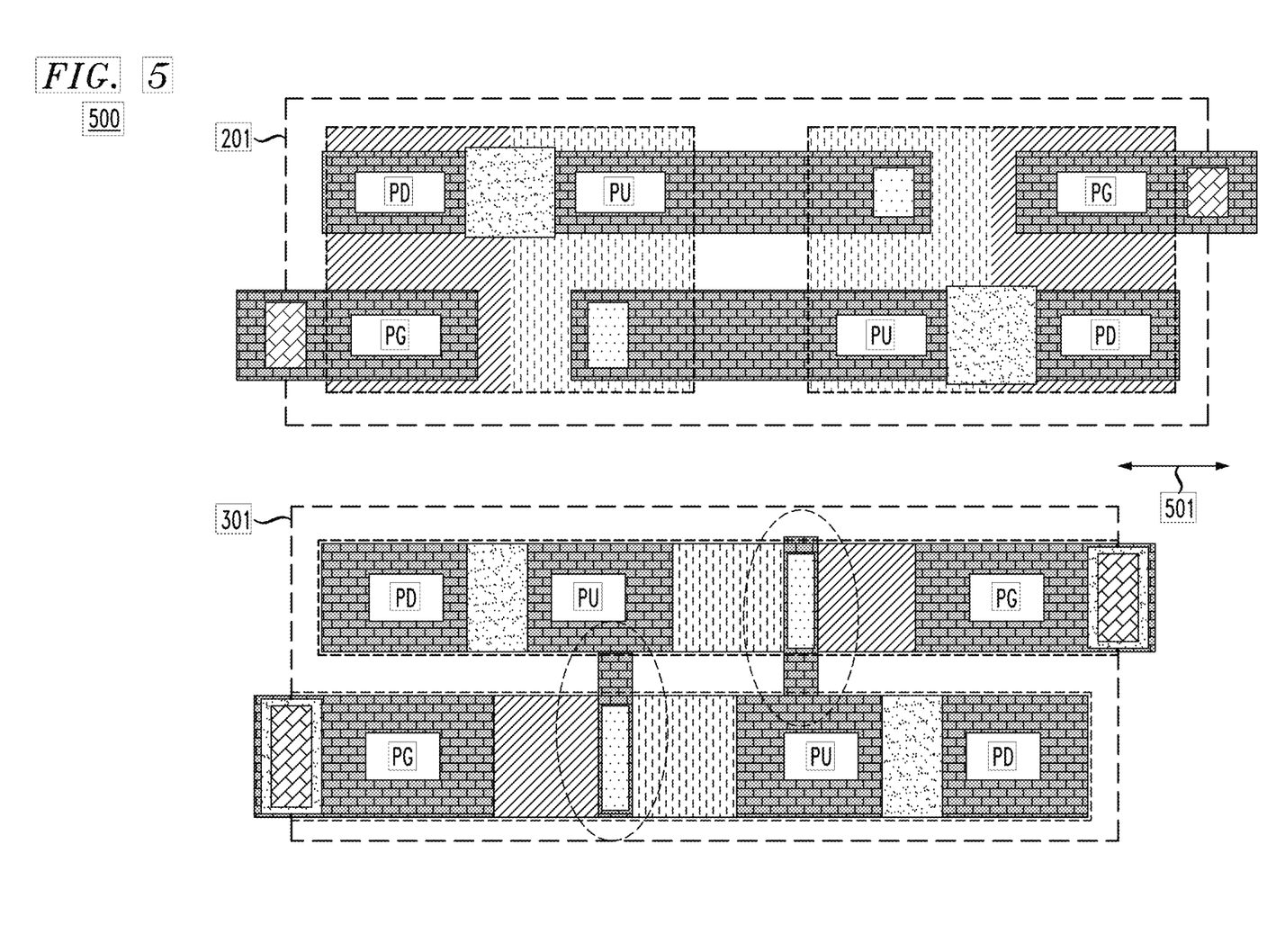
FIG. 5 is a plan view of the FIG. 2 and FIG. 3 memory cell layouts illustrating a reduction in size provided by the improved layout of the FIG. 3 memory cell, according to an embodiment of the present invention.

In the FIG. 3 layout of memory cell 301, the gate straps 308 are formed orthogonal or perpendicular to the gate regions 306-1 and 306-3, providing an improved SRAM cell layout relative to the FIG. 2 layout of memory cell 201. Advantageously, the improved layout of memory cell 301 permits a reduction in size relative to that of memory cell 201 (e.g., a reduction in size of approximately 10% in some embodiments). In addition, feature size and spacing is reduced resulting in improved manufacturability with efficient gate to adjacent cell strapping. FIG. 5 illustrates a plan view 500 of the FIG. 2 memory cell 201 and the FIG. 3 memory cell 301, illustrating the reduction in size 501 provided by the improved layout of memory cell 301.

The n-type regions 302-1 and 302-2 (collectively, n-type regions 302) may be formed of doped Si, such as arsenic (As) or phosphorous (P) doped Si, with dimensions in the X-X' direction ranging from 10 to 40 nm, and dimensions in the Y-Y' direction ranging from 10-50 nm. The p-type regions 304-1 and 304-2 (collectively, p-type regions 304) may also be formed of doped Si, such as boron (B) doped Si, or of SiGe or another suitable material. The dimensions of the p-type regions 304 may be similar to the dimensions of the n-type regions 302.

The gate regions 306 may be formed of a work function metal (WFM) material. For example, for NFET, the WFM may be aluminum (Al), titanium aluminum carbide (TiAlC), cobalt (Co), titanium aluminum nitride (TiAlN), ETC. For PFET, the WFM may be titanium nitride (TiN), tantalum nitride (TaN), Co, tungsten (W), etc. The WFM may be formed using atomic layer deposition (ALD), and range in thickness from a few angstrom to the tens of nanometers. The extended metal region of gate regions 361 and 362 may be formed through a lithography patterning process, with dimensions ranging in direction X-X' from 10 to 50 nm, in direction Y-Y' from 5 to 50 nm, and in direction Z-Z' into or through the page from 0.5 to 20 nm.

Gate straps 308 are gate contact vias, which punch through the metal gate underneath to connect to the active source/drain region below. Thus, the gate and the active bottom source/drain region will be connected. The dimensions of the gate straps 308 can range in direction X-X' and Y-Y' from 10 to 30 nm, and in direction Z-Z' into or through the page from 10 to 80 nm.

Contacts 310-1 and 310-2 (collectively, contacts 310) are gate contacts, which may formed of W, Co, combinations of one or more of W and Co and a wetting layer such as TiN or TaN, etc. The dimension of contacts 310 may range in direction X-X' and Y-Y' from 10 to 30 nm, and in direction Z-Z' into or through the page from 10 to 80 nm.

Patterning masks 312 are masks used for patterning the gate, such as during metal gate patterning. The patterning masks 312 protect the gate underneath so that the gate metal will be left there as a PD or PU gate connection (e.g., patterning masks 312-1 and 312-2) or as extra gate area for contact landing (e.g., patterning masks 312-3 and 312-4). The uncovered portions of the gate surrounding the devices (e.g., the PD, PU and PG transistors) are self-aligned to the vertical nanowire or nanosheet as a spacer shape, enabling the metal gate to remain even without any mask.

Figure 6:
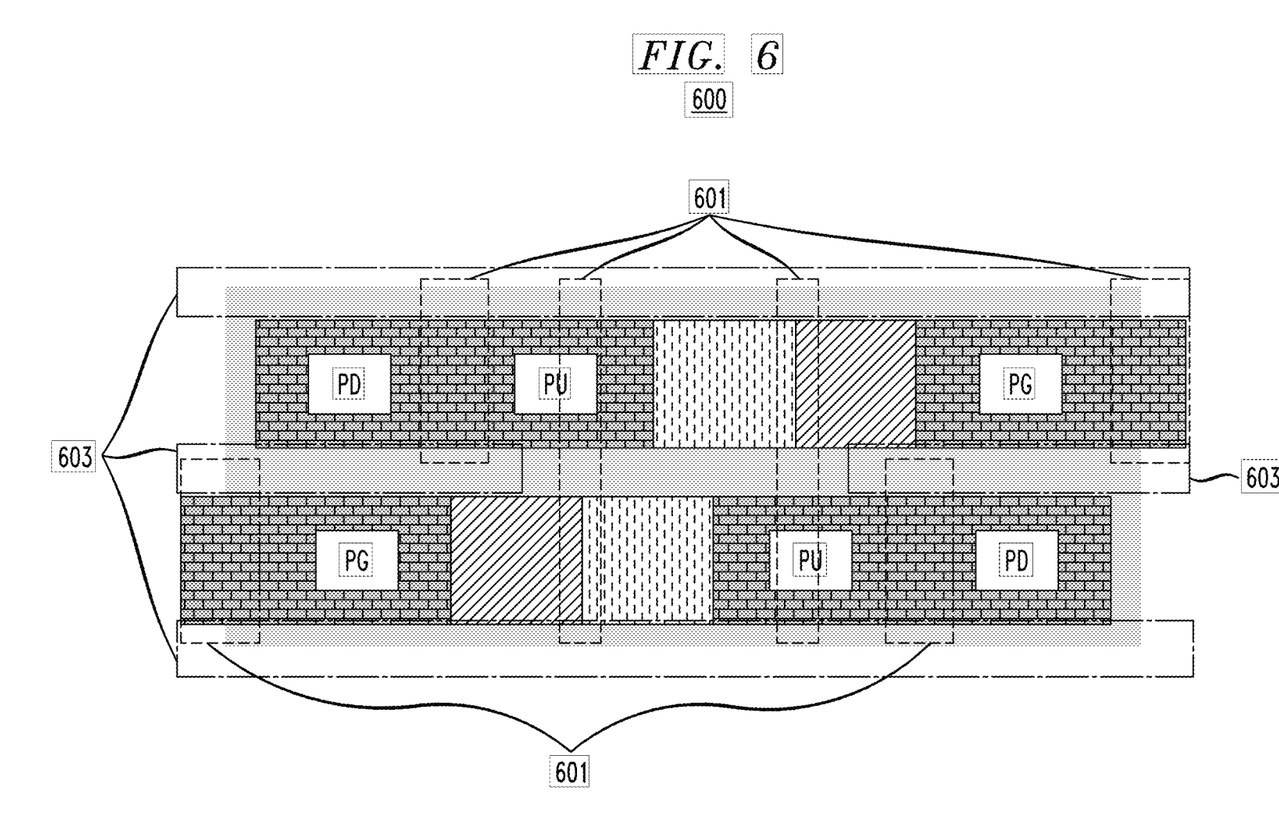
FIG. 6 is a plan view of the FIG. 3 memory cell illustrating block and cut masks used to form the FIG. 3 memory cell, according to an embodiment of the present invention.

FIG. 6 shows a plan view 600 of the memory cell 301, illustrating block or gate masks 601 defining areas and cut masks 603 defining areas to remove. Thus, the block masks 601 illustrate areas where material is added to form the gate straps 308 and contacts 310, while the cut masks 603 illustrate where material is removed or subtracted from the block masks 601 to form the gate straps 308 and contacts 310. Combining block masks 601 and cut masks 603 provides a gate patterning mask that protects the gate underneath, so that the gate metal will be left there, as PD or PU gate connections, extract gate area for contact landing, etc. Uncovered portions of the gate surrounding the PD, PU and PG transistor devices are self-aligned to the vertical nanowire or nanosheet as a spacer shape, which enables the metal gate to remain without any mask.

In some embodiments, a semiconductor structure comprises a vertical transport SRAM cell comprising a first active region and a second active region, the first active region and the second active region being linearly arranged in first and second rows, respectively. The first row of the first active region comprises a first pull-up transistor, a first pull-down transistor and a first pass gate transistor. The second row of the second active region comprises a second pull-up transistor, a second pull-down transistor and a second pass gate transistor. A first gate region of the first active region extends orthogonal from the first row to the second active region. A second gate region of the second active region extends orthogonal from the second row to the first active region.

The first pull-up transistor, the first pull-down transistor and the first pass gate transistor of the first active region may share a first common bottom source/drain region, and the second pull-up transistor, the second pull-down transistor and the second pass gate transistor of the second active region may share a second common bottom source/drain region. Each of the first common bottom source/drain region and the second common bottom source/drain region may comprise an n-doped portion and a p-doped portion. The first gate region may extend orthogonal from the first common bottom source/drain region to the second active region providing a first gate strap electrical connection between the first gate region and the second active region. The second gate region may extend orthogonal from the second common bottom source/drain region to the first active region providing a second gate strap electrical connection between the second gate region and the first active region.

The first pull-up transistor and the second pull-up transistor may comprise PFETs, and the first pull-down transistor, the second pull-down transistor, the first pass gate transistor and the second pass gate transistor may comprise NFETs. The first gate strap electrical connection between the first gate region and the second active region may be at a boundary between the NFET second pass gate transistor and the PFET second pull-up transistor. The first gate strap electrical connection may be self-aligned to the first gate region. The second gate strap electrical connection between the second gate region and the first active region may be at a boundary between the NFET first pass gate transistor and the PFET first pull-up transistor.

The semiconductor structure may further comprise a first contact to the first pass gate transistor and a second contact to the second pass gate transistor. At least one of the first contact and the second contact may comprise a shared contact with an adjacent SRAM cell.

In some embodiments, an integrated circuit comprises a SRAM device comprising one or more SRAM cells, with a given one of the SRAM cells comprising a first active region and a second active region. The first active region and the second active region are linearly arranged in first and second rows, respectively. The first row of the first active region comprises a first pull-up transistor, a first pull-down transistor and a first pass gate transistor. The second row of the second active region comprises a second pull-up transistor, a second pull-down transistor and a second pass gate transistor. A first gate region of the first active region extends orthogonal from the first row to the second active region, and a second gate region of the second active region extends orthogonal from the second row to the first active region.

The first pull-up transistor, the first pull-down transistor and the first pass gate transistor of the first active region may share a first common bottom source/drain region and the second pull-up transistor, the second pull-down transistor and the second pass gate transistor of the second active region may share a second common bottom source/drain region. The first gate region may extend orthogonal from the first common bottom source/drain region to the second active region providing a first gate strap electrical connection between the first gate region and the second active region, and the second gate region may extend orthogonal from the second common bottom source/drain region to the first active region providing a second gate strap electrical connection between the second gate region and the first active region.

The first pull-up transistor and the second pull-up transistor may comprise PFETs and the first pull-down transistor, the second pull-down transistor, the first pass gate transistor and the second pass gate transistor may comprise NFETs. The first gate strap electrical connection between the first gate region and the second active region may be at a boundary between the NFET second pass gate transistor and the PFET second pull-up transistor and the second gate strap electrical connection between the second gate region and the first active region may be at a boundary between the NFET first pass gate transistor and the PFET first pull-up transistor.

The given SRAM cell may further comprise a first contact to the first pass gate transistor and a second contact to the second pass gate transistor, at least one of the first contact and the second contact comprising a shared contact with an adjacent SRAM cell.

In some embodiments, a method of forming a semiconductor structure comprises forming a first active region comprising a first pull-up transistor, a first pull-down transistor and a first pass-gate transistor arranged linearly in a first row, forming a second active region comprising a second pull-up transistor, a second pull-down transistor and a second pass-gate transistor arranged linearly in a second row, forming a first gate region for the first active region that extends orthogonal from the first row to the second active region, and forming a second gate region for the second active region that extends orthogonal from the second row to the first active region. The first active region and the second active region provide a vertical transport SRAM cell.

The first pull-up transistor, the first pull-down transistor and the first pass gate transistor of the first active region may share a first common bottom source/drain region and the second pull-up transistor, the second pull-down transistor and the second pass gate transistor of the second active region may share a second common bottom source/drain region. The first gate region may extend orthogonal from the first common bottom source/drain region to the second active region providing a first gate strap electrical connection between the first gate region and the second active region, and the second gate region may extend orthogonal from the second common bottom source/drain region to the first active region providing a second gate strap electrical connection between the second gate region and the first active region.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a vertical transport static random-access memory (SRAM) cell comprising a first active region and a second active region;
   the first active region and the second active region being linearly arranged in first and second rows, respectively;
   the first row of the first active region comprising a first pull-up transistor, a first pull-down transistor and a first pass gate transistor;
   the second row of the second active region comprising a second pull-up transistor, a second pull-down transistor and a second pass gate transistor;
   wherein the first active region comprises a first common bottom source/drain region, the first common bottom source/drain region comprising a first p-doped portion, a first n-doped portion adjacent a first edge of the first p-doped portion providing a first p-n junction, and a second n-doped portion adjacent a second edge of the first p-doped portion providing a second p-n junction;
   wherein the second active region comprises a second common bottom source/drain region, the second common bottom source/drain region comprising a second p-doped portion, a third n-doped portion adjacent a first edge of the second p-doped portion providing a third p-n junction, and a fourth n-doped portion adjacent a second edge of the second p-doped portion providing a fourth p-n junction;
   wherein a first gate region of the first active region extends orthogonal from a first portion of the first row corresponding to the first p-doped portion of the first common bottom source/drain region to a second portion of the second row corresponding to the third p-n junction between the second p-doped portion and the third n-doped portion of the second common bottom source/drain region of the second active region; and
   wherein a second gate region of the second active region extends orthogonal from a third portion of the second row corresponding to the second p-doped portion of the second bottom source/drain region to a fourth portion of the first row corresponding to the second p-n junction between the first p-doped portion and the second n-doped portion of the first common bottom source/drain region of the first active region.

2. The semiconductor structure of claim 1, wherein the first pull-up transistor, the first pull-down transistor and the first pass gate transistor of the first active region share the first common bottom source/drain region.

3. The semiconductor structure of claim 2, wherein the second pull-up transistor, the second pull-down transistor and the second pass gate transistor of the second active region share the second common bottom source/drain region.

4. The semiconductor structure of claim 3, wherein the first gate region provides a first gate strap electrical connection between the first gate region and the second active region.

5. The semiconductor structure of claim 4, wherein the second gate region provides a second gate strap electrical connection between the second gate region and the first active region.

6. The semiconductor structure of claim 5, wherein the first pull-up transistor and the second pull-up transistor comprise p-type field-effect transistors (PFETs) and the first pull-down transistor, the second pull-down transistor, the first pass gate transistor and the second pass gate transistor comprise n-type field-effect transistors (NFETs).

7. The semiconductor structure of claim 6, wherein the first gate strap electrical connection between the first gate region and the second active region is at a boundary between the NFET second pass gate transistor and the PFET second pull-up transistor.

8. The semiconductor structure of claim 6, wherein the first gate strap electrical connection is self-aligned to the first gate region.

9. The semiconductor structure of claim 6, wherein the second gate strap electrical connection between the second gate region and the first active region is at a boundary between the NFET first pass gate transistor and the PFET first pull-up transistor.

10. The semiconductor structure of claim 1, further comprising a first contact to the first pass gate transistor and a second contact to the second pass gate transistor.

11. The semiconductor structure of claim 10, wherein at least one of the first contact and the second contact comprises a shared contact with an adjacent SRAM cell.

12. The semiconductor structure of claim 1, wherein the first p-n junction in the first row is laterally offset from the third p-n junction in the second row.

13. The semiconductor structure of claim 1, wherein the second p-n junction in the first row is laterally offset from the fourth p-n junction in the second row.

14. The semiconductor structure of claim 1, wherein the first pull-up transistor in the first row is laterally offset from the second pull-up transistor in the second row.

15. An integrated circuit comprising:
   a vertical transport static random-access memory (SRAM) device comprising one or more SRAM cells;
   a given one of the SRAM cells comprising a first active region and a second active region;
   the first active region and the second active region being linearly arranged in first and second rows, respectively;
   the first row of the first active region comprising a first pull-up transistor, a first pull-down transistor and a first pass gate transistor;
   the second row of the second active region comprising a second pull-up transistor, a second pull-down transistor and a second pass gate transistor;
   wherein the first active region comprises a first common bottom source/drain region, the first common bottom source/drain region comprising a first p-doped portion, a first n-doped portion adjacent a first edge of the first p-doped portion providing a first p-n junction, and a second n-doped portion adjacent a second edge of the first p-doped portion providing a second p-n junction;
   wherein the second active region comprises a second common bottom source/drain region, the second common bottom source/drain region comprising a second p-doped portion, a third n-doped portion adjacent a first edge of the second p-doped portion providing a third p-n junction, and a fourth n-doped portion adjacent a second edge of the second p-doped portion providing a fourth p-n junction;

wherein a first gate region of the first active region extends orthogonal from a first portion of the first row corresponding to the first p-doped portion of the first common bottom source/drain region to a second portion of the second row corresponding to the third p-n junction between the second p-doped portion and the third n-doped portion of the second common bottom source/drain region of the second active region; and wherein a second gate region of the second active region extends orthogonal from a third portion of the second row corresponding to the second p-doped portion of the second bottom source/drain region to a fourth portion of the first row corresponding to the second p-n junction between the first p-doped portion and the second n-doped portion of the first common bottom source/drain region of the first active region.

16. The integrated circuit of claim 15, wherein the first pull-up transistor, the first pull-down transistor and the first pass gate transistor of the first active region share the first common bottom source/drain region and the second pull-up transistor, the second pull-down transistor and the second pass gate transistor of the second active region share the second common bottom source/drain region.

17. The integrated circuit of claim 16, wherein the first gate region provides a first gate strap electrical connection between the first gate region and the second active region, and wherein the second gate region provides a second gate strap electrical connection between the second gate region and the first active region.

18. The integrated circuit of claim 17, wherein the first pull-up transistor and the second pull-up transistor comprises p-type field-effect transistors (PFETs) and the first pull-down transistor, the second pull-down transistor, the first pass gate transistor and the second pass gate transistor comprise n-type field-effect transistors (NFETs).

19. The integrated circuit of claim 18, wherein the first gate strap electrical connection between the first gate region and the second active region is at a boundary between the NFET second pass gate transistor and the PFET second pull-up transistor and the second gate strap electrical connection between the second gate region and the first active region is at a boundary between the NFET first pass gate transistor and the PFET first pull-up transistor.

20. The integrated circuit of claim 15, wherein the given SRAM cell further comprises a first contact to the first pass gate transistor and a second contact to the second pass gate transistor, at least one of the first contact and the second contact comprising a shared contact with an adjacent SRAM cell.

* * * * *